(12) United States Patent
Straka et al.

(10) Patent No.: US 8,137,141 B2
(45) Date of Patent: Mar. 20, 2012

(54) HIGH-SPEED CONNECTOR WITH MULTI-STAGE COMPENSATION

(75) Inventors: Frank M. Straka, Chicago, IL (US); Ronald L. Tellas, Schereville, IN (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 12/544,626

(22) Filed: Aug. 20, 2009

(65) Prior Publication Data

US 2010/0048040 A1 Feb. 25, 2010

Related U.S. Application Data

(60) Provisional application No. 61/090,403, filed on Aug. 20, 2008.

(51) Int. Cl.
*H01R 24/00* (2011.01)
(52) U.S. Cl. ......................................... 439/676
(58) Field of Classification Search .................. 439/676, 439/941, 620.11, 620.17
See application file for complete search history.

(56) References Cited

U.S. PATENT DOCUMENTS

| | | |
|---|---|---|
| 5,186,647 A | 2/1993 | Denkmann et al. |
| 5,299,956 A | 4/1994 | Brownell et al. |
| 5,326,284 A | 7/1994 | Bohbot et al. |
| 5,362,254 A | 11/1994 | Siemon et al. |
| 5,454,738 A | 10/1995 | Lim et al. |
| 5,470,244 A | 11/1995 | Lim et al. |
| 5,513,065 A | 4/1996 | Caveney et al. |
| 5,618,185 A | 4/1997 | Aekins |
| 5,700,167 A | 12/1997 | Pharney et al. |
| 5,797,764 A | 8/1998 | Coulombe et al. |
| 5,911,602 A | 6/1999 | Vaden |
| 5,940,959 A | 8/1999 | Caveney et al. |
| 5,967,853 A | 10/1999 | Hashim |
| 5,997,358 A | 12/1999 | Adriaenssens et al. |
| 6,017,247 A | 1/2000 | Gwiazdowski |
| 6,089,923 A | 7/2000 | Phommachanh |
| 6,106,335 A | 8/2000 | Merchant et al. |
| 6,120,330 A | 9/2000 | Gwiazdowski |
| 6,176,742 B1 | 1/2001 | Arnett et al. |
| 6,186,834 B1 | 2/2001 | Arnett et al. |
| 6,196,880 B1 | 3/2001 | Goodrich et al. |
| 6,231,397 B1 | 5/2001 | de la Borbolla et al. |
| 6,305,950 B1 | 10/2001 | Doorhy |
| 6,319,069 B1 | 11/2001 | Gwiazdowski |
| 6,350,158 B1 | 2/2002 | Arnett et al. |
| 6,402,560 B1 | 6/2002 | Lin |
| 6,409,547 B1 | 6/2002 | Reede |
| 6,483,715 B1 | 11/2002 | Chen |
| 6,533,618 B1 | 3/2003 | Aekins |
| 6,722,894 B2 | 4/2004 | Burmeister |

(Continued)

FOREIGN PATENT DOCUMENTS

EP 0854664 A1 7/1998

(Continued)

*Primary Examiner* — Ross N Gushi
(74) *Attorney, Agent, or Firm* — Robert A. McCann; Zachary J. Smolinski; Christopher S. Clancy

(57) ABSTRACT

A communication connector uses compensation circuitry to compensate for crosstalk in a network connection. Portions of the compensation circuitry are placed on a flexible circuit board that makes conductive contact with plug interface contacts of the connector. Additional compensation circuitry is provided on a rigid circuit board within the connector.

7 Claims, 14 Drawing Sheets

U.S. PATENT DOCUMENTS

| | | | |
|---|---|---|---|
| 6,866,548 B2 * | 3/2005 | Hashim | 439/676 |
| 7,153,168 B2 | 12/2006 | Caveney et al. | |
| 7,179,131 B2 | 2/2007 | Caveney et al. | |
| 7,182,649 B2 | 2/2007 | Caveney et al. | |
| 7,252,554 B2 | 8/2007 | Caveney et al. | |
| 7,281,957 B2 * | 10/2007 | Caveney | 439/676 |
| 7,309,261 B2 | 12/2007 | Caveney et al. | |
| 7,367,849 B2 | 5/2008 | Wang et al. | |
| 7,384,315 B2 | 6/2008 | Caveney et al. | |
| 7,442,092 B2 | 10/2008 | Caveney et al. | |
| 7,452,246 B2 | 11/2008 | Caveney et al. | |
| 7,481,681 B2 | 1/2009 | Caveney et al. | |
| 7,520,784 B2 | 4/2009 | Caveney et al. | |
| 7,561,005 B2 | 7/2009 | Harada et al. | |
| 7,576,627 B2 | 8/2009 | Shastry et al. | |
| 7,591,689 B2 | 9/2009 | Caveney et al. | |
| 7,618,296 B2 | 11/2009 | Caveney | |
| 2002/0171505 A1 | 11/2002 | Aekins et al. | |
| 2005/0009382 A1 | 1/2005 | Burmeister et al. | |
| 2007/0238366 A1 | 10/2007 | Hammond, Jr. et al. | |
| 2007/0238367 A1 | 10/2007 | Hammond, Jr. et al. | |
| 2009/0163084 A1 | 6/2009 | Straka et al. | |

FOREIGN PATENT DOCUMENTS

| | | |
|---|---|---|
| EP | 1246318 A2 | 10/2002 |
| WO | 2004047240 A2 | 6/2004 |
| WO | 2005101579 A1 | 10/2005 |

* cited by examiner

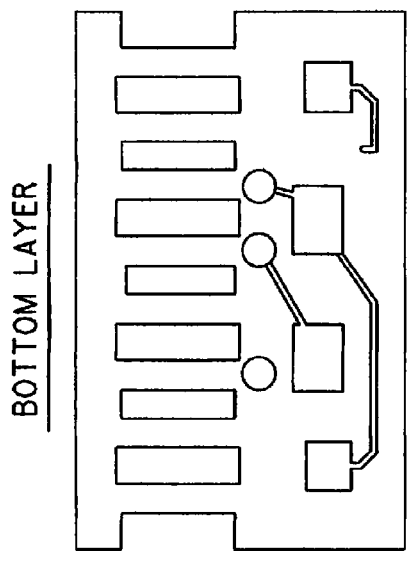
FIG.4
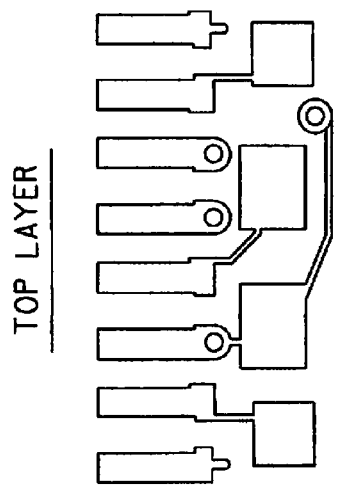
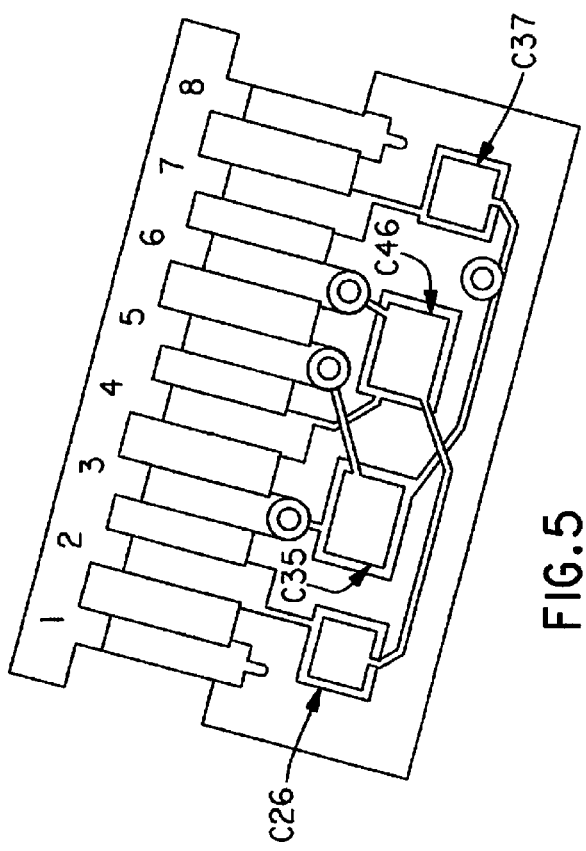
FIG.5

SCHEMATIC OF THE RIDGID CIRCUIT BOARD 16

ISOMETRIC VIEW OF THE RIDGID BOARD 16

SCHEMATIC FOR PAIR COMBINATION 45-78

SCHEMATIC FOR PAIR COMBINATION 45-12

SCHEMATIC FOR PAIR COMBINATION 36-12

SCHEMATIC FOR PAIR COMBINATION 36-78

FIG. 13  SCHEMATIC FOR PAIR COMBINATION 45-36

4 LAYERS OF THE ADDITIONAL EMBODIMENT 1 OF RIDGID CIRCUIT BOARD 16

4 LAYERS OF THE ADDITIONAL EMBODIMENT 2 OF RIDGID CIRCUIT BOARD 16

ADDITIONAL EMBODIMENT 2 SCHEMATIC FOR PAIR COMBINATION 45-12

HIGH-SPEED CONNECTOR WITH MULTI-STAGE COMPENSATION

CROSS REFERENCE TO RELATED APPLICATIONS

This application claims priority to U.S. Provisional Patent Application No. 61/090,403, filed Aug. 20, 2008, the subject matter of which is hereby incorporated by reference in its entirety.

BACKGROUND

There is a need to improve near-end crosstalk (NEXT), far-end crosstalk (FEXT) and return loss performance of communications connectors at higher frequencies in a robust design that can be relatively easily manufactured. This description is directed to a method of improving the performance of a communication connector by employing specific capacitive and inductive couplings on a printed circuit board (PCB) within the connector.

DESCRIPTION OF THE INVENTION

An improved electrical communication jack having improved NEXT, FEXT, and return loss performance is shown and described. Additionally, this jack reduces the differential-to-common and common-to-differential mode conversion (herein referred to as "mode conversion") that occurs within the jack to improve the alien crosstalk performance of the system.

Figure 1:
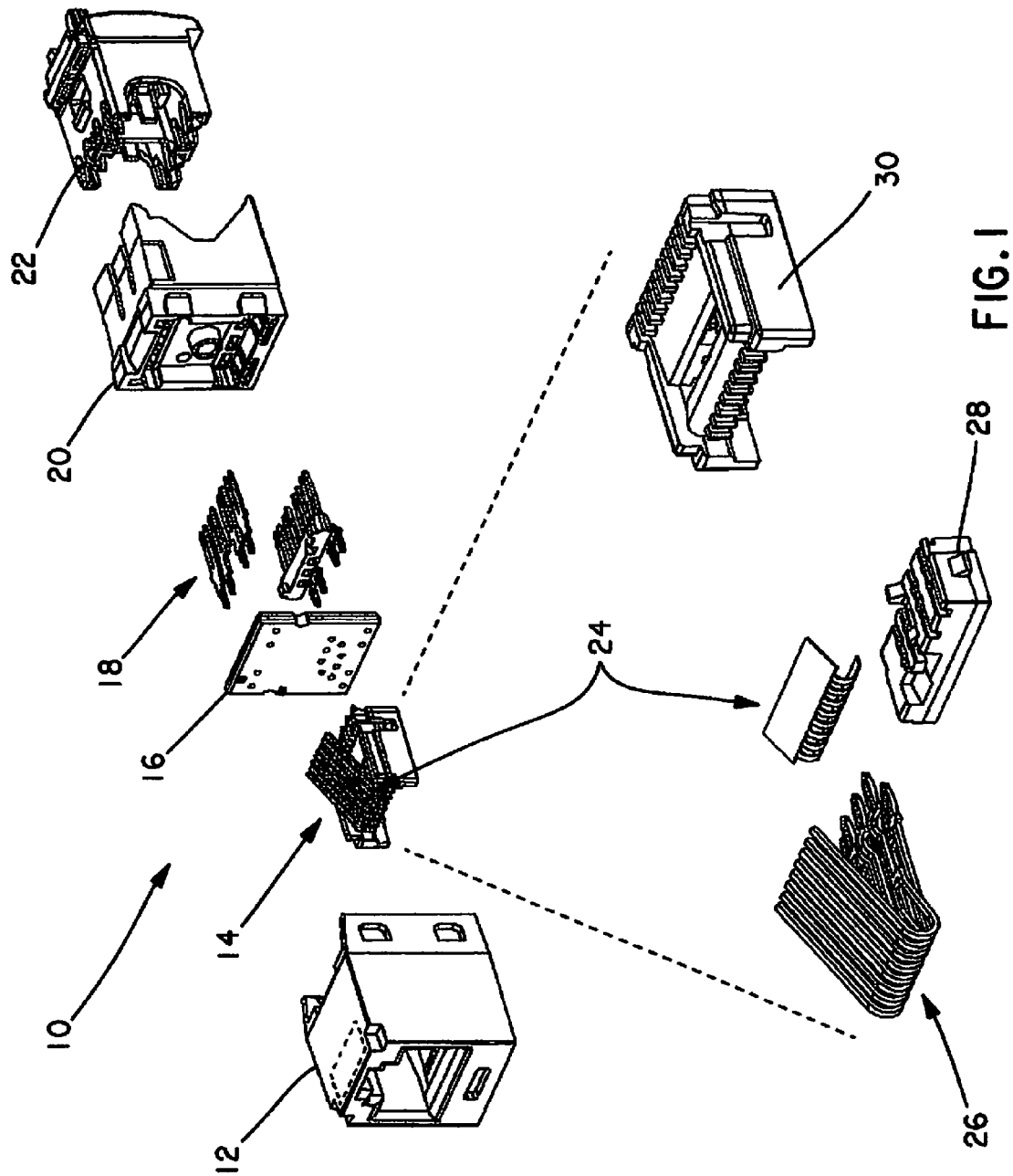

The printed circuit board (PCB) designs described herein may be employed in an EIA/TIA CAT6A modular jack assembly, which includes a two-stage capacitor compensation/crosstalk with time delay, employs a version of a lattice network as described further below, and exhibits improved mode conversion properties. In some embodiments, a flex board 24 and rigid board 16, as shown in FIG. 1, work together to provide the desired performance characteristics of the jack.

Time delay compensation in an electrical connector achieves improved transmission performance for near-end crosstalk by introducing predetermined amounts of compensation and crosstalk between two pairs of conductors that extend from the connector's input terminals to its output terminals along interconnection paths. Electrical signals on one pair of conductors are coupled onto the other pair of conductors in two or more compensation stages that are time delayed with respect to each other. Generally, in a first stage the compensating crosstalk nearer to the plug is of an opposite magnitude of the net crosstalk caused by the plug. The second stage of crosstalk is generally of the same polarity as the net crosstalk caused by the plug, and is placed further away from the plug than the first stage. The differing time delays between the stages cause the phases of these stages to change at different rates with increasing frequency. This then creates a specific frequency where all of the stages add together to essentially cancel out and create a null, which in turn increases the overall NEXT bandwidth of the mated plug and jack.

According to one embodiment of the present invention, a CAT6A RJ45 jack 10 has a housing 12 that fits an RJ45 plug, a nose 14 that has eight plug interface contacts (PICs) that mate with a plug and interface with a rigid board 16, where the rigid board 16 connects to insulation displacement contacts (IDCs) 18, a rear sled 20 that holds the IDCs, and a wire cap 22 that allows for wires within cabling (not shown) to connect with the IDCs. The nose 14 also includes a flex circuit board 24, plug interface contacts 26, front bottom sled 28 and front top sled 30. Both the flex circuit board 24 and rigid circuit board 16 contain circuitry designed to improve NEXT, FEXT, return loss, and mode conversion properties of the jack.

CAT6A products generally have eight wires that make up four differential pairs. These wires are numbered numerically 1 through 8, and the differential pairs are 45, 36, 12, and 78 (pairs 1, 2, 3, and 4, respectively). The layout of these wires within an RJ45 plug causes crosstalk between these differential pairs that must be compensated for within a jack. Since there are four differential pairs, near end crosstalk (NEXT) can form between the six different pair combinations. These pair combinations are 45-36, 45-12, 45-78, 36-12, 36-78, and 12-78. In different embodiments of the present invention, compensation is achieved by positioning traces on circuit boards within a jack.

Self-inductive stubs as used herein (shown in FIGS. 2, 6-8, and 13-15) refer to circuit board traces that are made specific lengths to create a self-inductance of a given value. The term "stub" refers to the fact that these traces are not part of the main current carrying path. They are stubs off of the current carrying path, and end in a capacitor (having no DC connections at their ends). Current carrying paths are traces that allow a DC current to flow between two points (such as the RJ45 plug and the insulation displacement contacts 16 (IDCs) in the jack).

A lattice network as described herein generally includes a crosstalk circuit component and a compensation circuit component each of which has a different coupling rate versus frequency. A "crosstalk circuit component" is a circuit component in which coupling occurs with the same polarity as the crosstalk-producing coupling within a plug, while a "compensation circuit component" is a circuit component in which coupling occurs at a polarity that is opposite the polarity of the crosstalk coupling that occurs within a plug.

The version of the lattice network used in this invention adds a second self-inductive stub connected between a capacitor and the second signal trace to the 2nd stage crosstalk network. Previous designs have employed what could be called an "LC" circuit, having most of the inductance attached to one end of the capacitor. The design of one embodiment of the current invention could be termed an "LCL" circuit, having the inductor split such that significant inductances are used on both sides of the capacitor.

Self-inductive stubs, as described herein, use the distributed electrical parameter of inductance per unit length of the circuit trace to produce inductive elements. Although this is modeled in the schematics as a discrete inductor (which is appropriate as it has an equivalent effect) it is a distributed inductive component produced by the length of the traces as opposed to turns of a wire coil, for example. In contrast, the capacitors shown herein are discrete capacitors although both the capacitors and the inductors shown can be realized by discrete or distributed components, or as a combination thereof.

Figure 2:
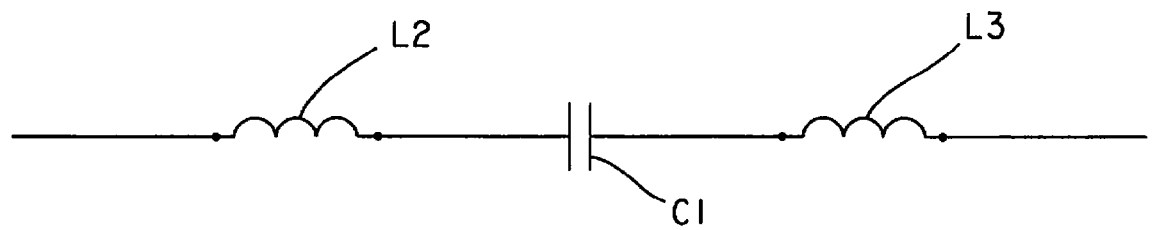

Positioning a capacitor between two stubs improves NEXT performance, relative to the opposite transmission direction (IDC to PIC), compared to putting a single inductor on only one side of that capacitor, where the inductance of the single inductor, L1, is about equal to L2+L3 as shown in FIG. 2. Additionally, the second stub shows improvement in return loss, also relative to using only a "one-sided" inductor.

Figure 6:
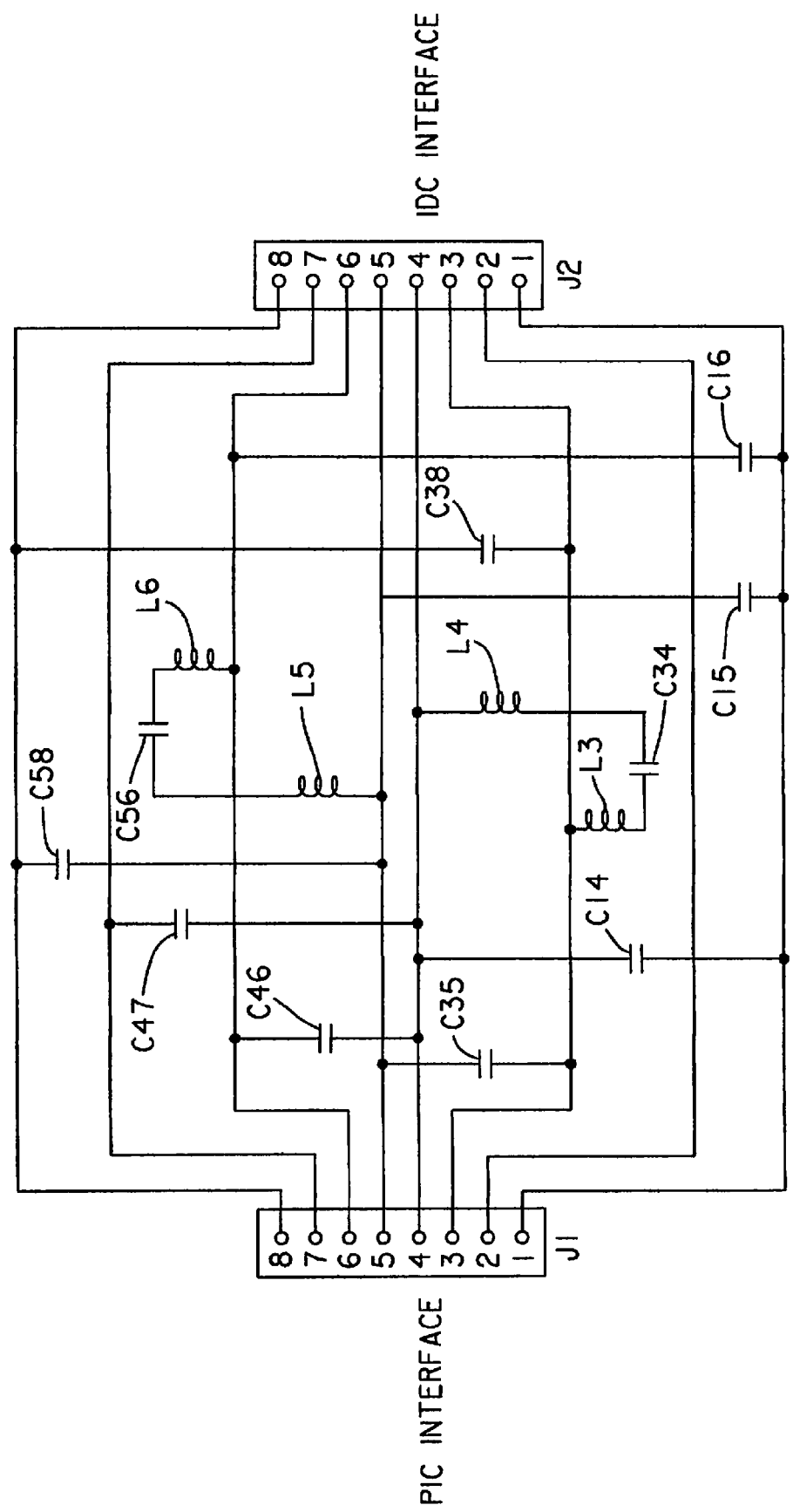

The self inductive stubs, along with corresponding capacitors (for example, the L5-C56-L6 combination and L3-C34-L4 combination as shown in FIG. 6), may be modeled as an LC circuit with a resonance effect having a resonant frequency of $f_o = 1/(2\pi\sqrt{LC})$. The selection of the inductance and capacitance values (i.e., the Ls and the Cs) is generally a nonlinear multivariable optimization with multiple objective functions, (the "objective functions" being improved NEXT, FEXT, return loss, etc.). Consequently, selection of a given L or C value is not made independent of other circuit considerations. Some of the considerations for selecting a given L value include: if it is too low the resonance point moves to a higher frequency and there is no desired NEXT improvement in the signal frequency operation range of interest; if the inductance is too high: a) the inductive traces become too long to fit on a typical rigid board; b) the resonance can move into the frequency operation range of interest, possibly introducing deleterious effects; and c) there can be a degradation of return loss.

The general design of a CAT 6A jack according to one embodiment of the present invention uses a two-stage capacitor compensation/crosstalk with time delay for pair combinations 45-36, 36-12, 36-78, and 45-12. The flex board 24 contains the first stage capacitors in the time delay model for pair combinations 45-36, 36-12, and 36-78 (the flex board includes capacitors C35, C45, C26, and C37). The rigid board 16 then contains the second stage capacitors in the time delay model for specific pair combinations (C46, C56, C16, and C38). The combination of a flex board 24 and a rigid board 16 for pair combination 45-36 also includes a lattice network which additionally uses self-inductors L3, L4, L5, and L6 and the additional capacitors C35 and C46 on the rigid board 16 (there is no lattice network on any other pairs for this embodiment).

This description takes into account the following:

All capacitor dimensions given are referenced relative to the amount of overlap occurring between the pads. One conductive layer of each capacitor is oversized 10 mils to help account for layer-to-layer registration. The dimensions given are for the smaller layer. According to one embodiment, rigid board capacitors are formed across a 4 mil core, generally made of an FR4 material having a dielectric constant of approximately 4.4 . Flex board capacitors are formed across a 1 mil core, generally made of a material having a dielectric constant of approximately 3.4.

The schematics shown for each description include only the intentional capacitance added by design. For example, mutual inductance between wires is purposely not shown for schematic clarity and due to the fact that any mutual inductance that results from the design is not intentionally used for compensation.

These schematics do not show parasitic capacitances caused by the geometry of the setup unless this parasitic capacitance is deemed important to note (values greater than 0.1 pF). These values are noted, but not labeled with reference characters.

The schematics shown for each pair combination (FIGS. 9-13) do not show all connections since they are only showing two pairs at once. A full schematic of the rigid board 16 can be seen in FIG. 6.

The distance causing a time delay from the flex board to the PIC interface on the rigid board is approximated as 0.5" for all pair combinations.

The schematics shown attempt to approximate a "middle plug" which by definition per the EIA/TIA CAT6A standards refers to a plug whose crosstalk value is in the middle of the range of crosstalk values specified for that pair combination.

All circuit board dimensions described herein are each individually subject to change (estimates up to 20%). One reason for this is variability of circuit board build tolerances from different circuit board manufacturers. Different materials or different processes may be used to manufacture the circuit boards. Therefore, the performance of the circuit board may change even though the artwork is identical due to the capacitance changing. Another reason is to allow for design changes required to compensate the many different jack designs (for example, modular jacks, shielded jacks, and unshielded jacks). Consequently, good engineering practice requires the ability to change the area of overlap for the pad capacitors by the specification tolerance (±20%). This change in area may be done on a capacitor-by-capacitor basis, and the overall board design (trace layout, use of time delay, lattice) remains identical. Some variants may only require changing the size of one or two capacitors (either smaller or larger), and some may require changing the sizes of all capacitors.

The jack designs described herein can be used for several types of products, among them shielded, unshielded, and punchdown-type connectors. Further, the jack housing 12 or another component of the jack may be covered with a conductive foil to reduce alien crosstalk effects.

Flex Circuit Board

Figure 3:
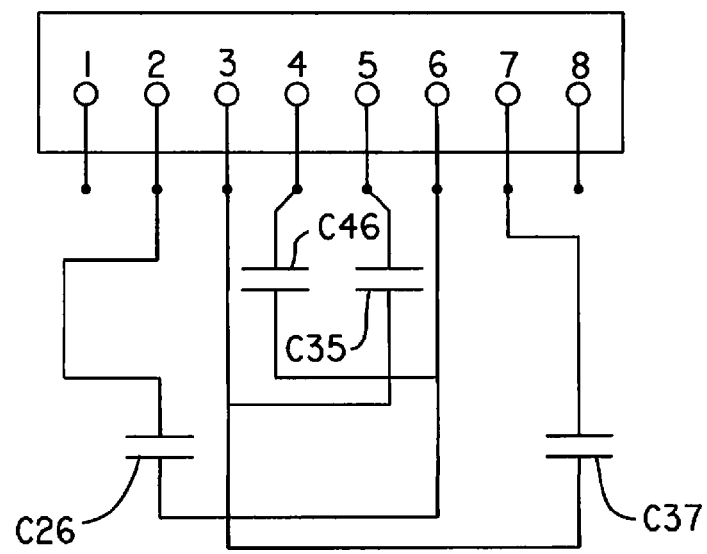

The flex circuit board 24 shown in FIG. 1 is described in more detail in FIGS. 3-5. FIG. 3 shows a schematic diagram of the flex circuit board, FIG. 4 shows the traces provided on two conductive layers of the flex circuit board, and FIG. 5 is a perspective view of the flex circuit board in which both layers of conductive traces are visible. The flex circuit board contains the 1$^{st}$ stage compensation in the time delay model for pair combinations 45-36, 36-12, and 36-78. This is done by the flex circuit board 24 employing pad capacitors to add compensating crosstalk having a polarity opposite that of the plug. These pad capacitors are C46 and C35 for pair combination 45-36, C26 for pair combination 36-12, and C37 for pair combination 36-78. Additionally, the capacitance values of the capacitors are chosen so that the mode conversion across the pairs 45-36, 36-12, and 36-78 is reduced.

Referring to FIGS. 3-5, the flex circuit board has the following features:

1) The flex board 24 wraps around the nose 14 such that the top layer of the flex board makes contact with the PICs (the area where contact is made is highlighted in FIG. 5).
2) Crosstalk compensation with a polarity opposite that of the plug for pair combination 45-36 is provided by pad capacitors C35 and C46. The area of each pad capacitor is 0.0323" by 0.044" (±20%), and each has a capacitance of approximately 1.2 pF. The schematic for pair combination 45-36 can be seen in FIG. 13.
3) Crosstalk compensation with a polarity opposite that of the plug for pair combination 36-12 is provided by pad capacitor C26. The area of this pad capacitor is 0.03" by 0.033" (±20%), and the capacitor has a capacitance of approximately 0.85 pF. The schematic for pair combination 36-12 can be seen in FIG. 11.
4) Crosstalk compensation with a polarity opposite that of the plug for pair combination 36-78 is provided by pad capacitor C37. The area of this pad capacitor is 0.03" by 0.033" (±20%), and the capacitor has a capacitance of approximately 0.85 pF. The schematic for pair combination 36-78 can be seen in FIG. 12.

Rigid Circuit Board 16

Figure 7:
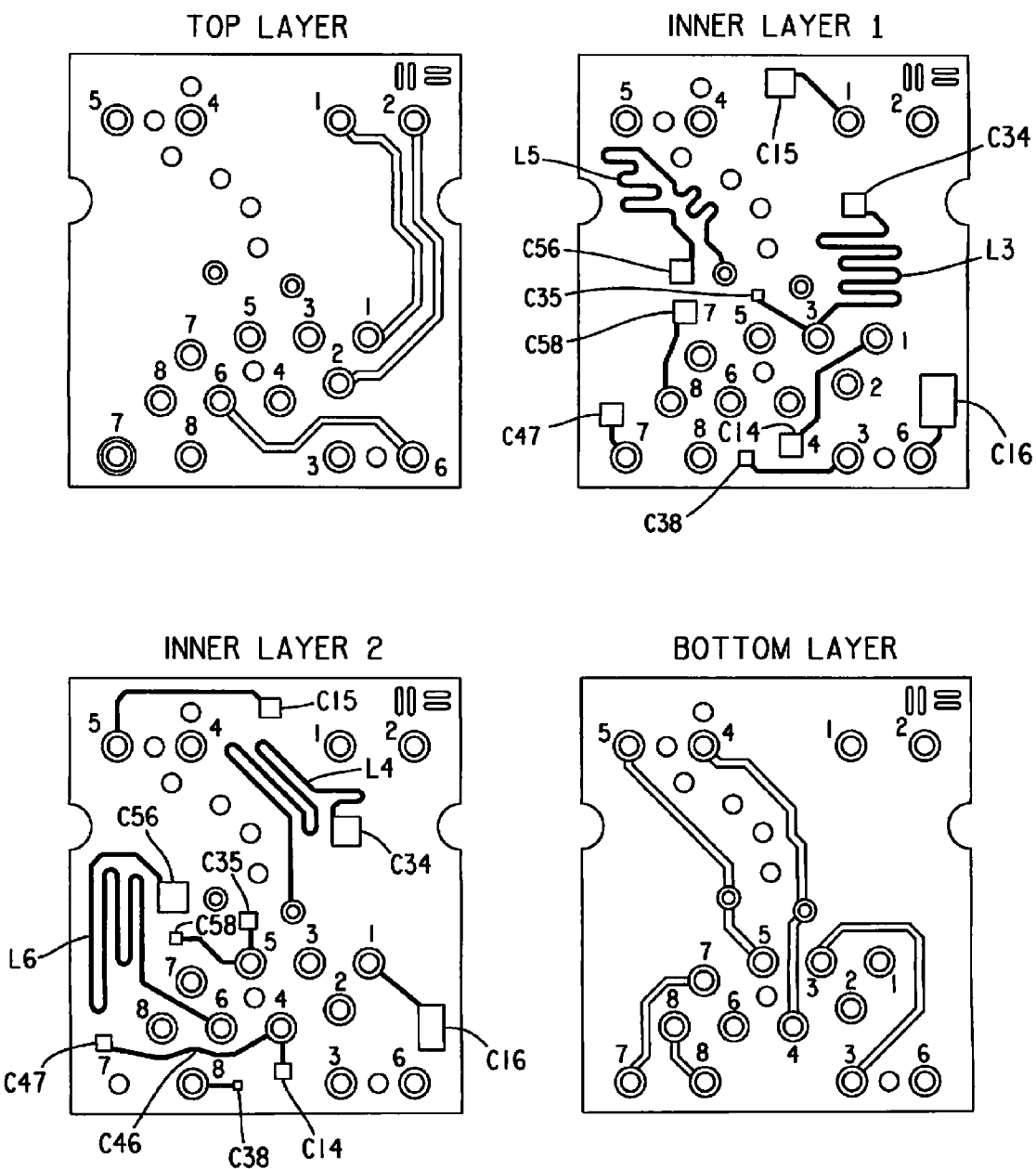
Figure 8:
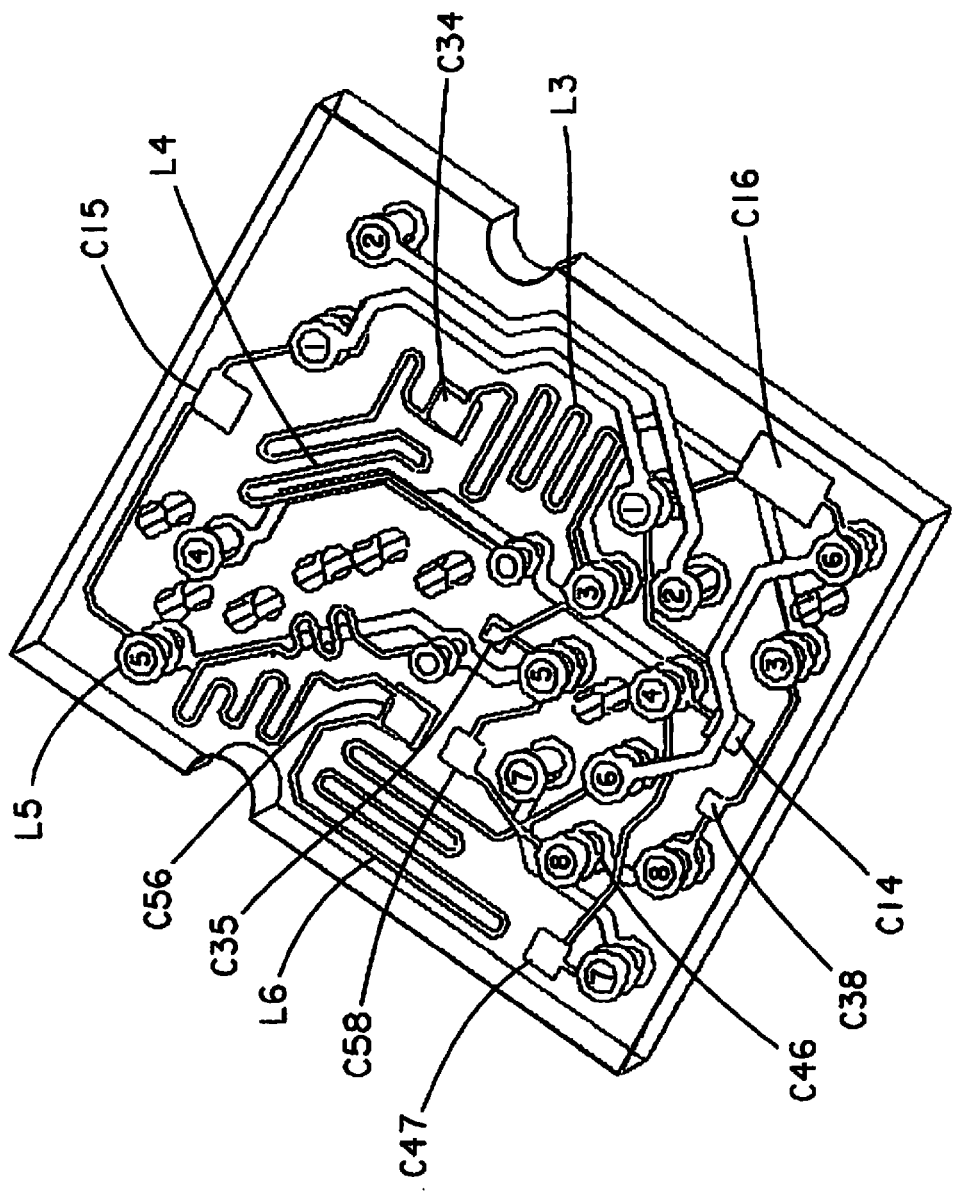

The rigid circuit board 16 shown in FIG. 1 is illustrated in more detail in FIGS. 6-8. FIG. 6 shows a schematic view of the rigid circuit board, FIG. 7 shows conductor layouts on different layers of the board, and FIG. 8 is a "see-through"

perspective view showing all of the conductive layers of the board. The rigid circuit board 16 contains the 1$^{st}$ and only stage of crosstalk compensation for pair combination 45-78. It contains both the 1$^{st}$ and 2$^{nd}$ stage of time delay crosstalk for pair combination 45-12. Additionally, it contains the 2$^{nd}$ stage of crosstalk in the time delay model for pair combinations 36-12 and 36-78. It also contains the 2$^{nd}$ stage lattice network crosstalk for pair combination 45-36. The method of adding capacitors on the rigid board is chosen so that the mode conversion across all pairs is reduced.

Figure 9:
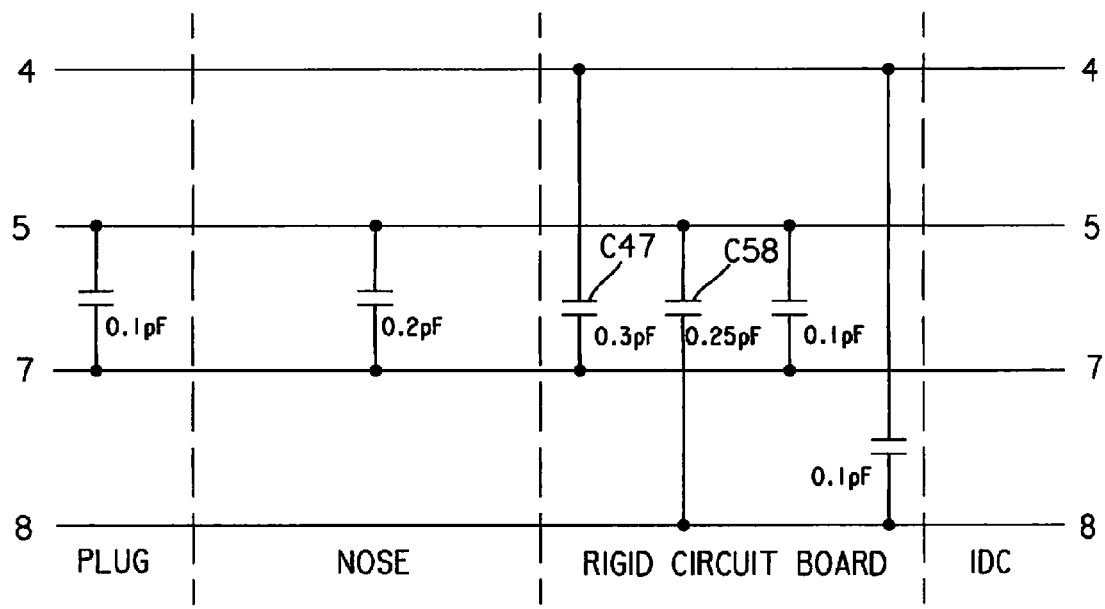
Figure 10:
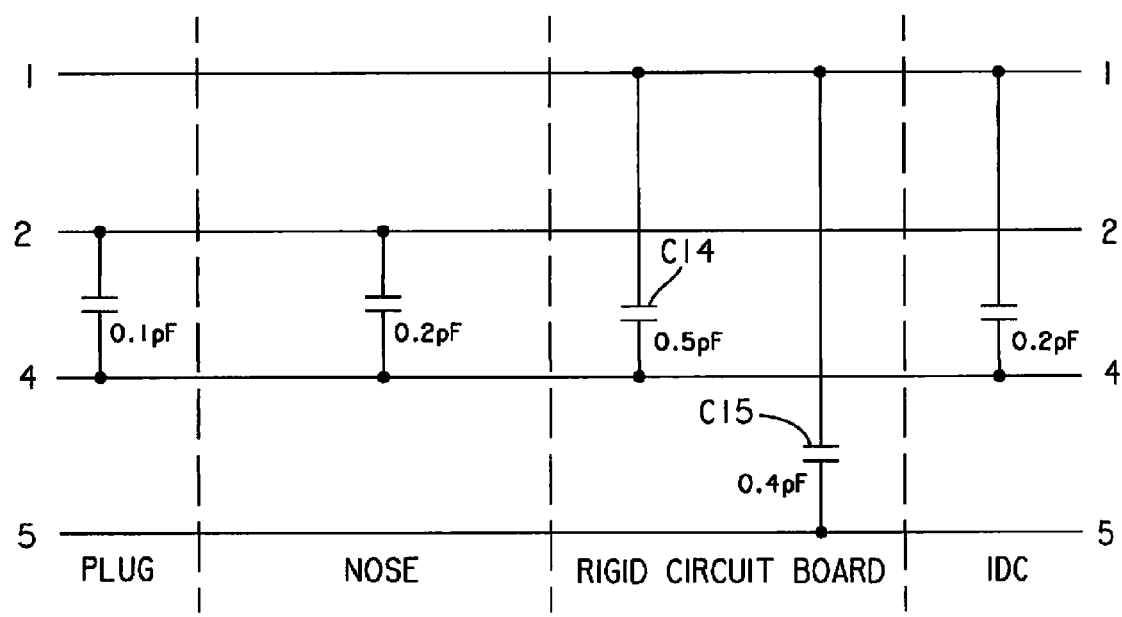

Referring to FIGS. 6-8, one embodiment of the rigid circuit board has the following features:

1) This rigid board design incorporates non-plated holes drilled into the board (some are highlighted in FIG. 8). These holes are used to reduce the distributed capacitance between wires 4 and 5; and 3 and 6 by lowering the effective dielectric constant between respective traces through the addition of air gaps so that the return loss on these pairs is further improved. This "variable dielectric" over the length of a trace can be used to improve performance of the jack.
2) Current carrying traces are routed between PIC vias and IDC vias with the respective pin numbers. PIC vias refer to the vias where the compliant pins from nose 14 interface with the rigid circuit board 16, shown in FIG. 1. The IDC vias refer to the vias where the IDCs 18 interface with the rigid circuit board 16.
3) Crosstalk having the opposite polarity of the net crosstalk caused by the plug for pair combination 45-78 is provided by pad capacitor C47 connected between the 4 and 7 PIC vias, and by pad capacitor C58 connected between the 5 and 8 PIC vias. Both of these capacitors have areas of 0.02" by 0.02" (±20%). A schematic for pair combination 45-78 is shown in FIG. 9.
4) Crosstalk compensation for pair combination 45-12 is achieved by using the time delay model. A schematic for pair combination 45-12 is shown in FIG. 10. Pad capacitor C14 has the opposite polarity from the net crosstalk caused by the plug for pair combination 45-12 and connects between PIC vias 1 and 4. Pad capacitor C15 has the same polarity as the net crosstalk caused by the plug for pair combination 45-12 and connects between IDC vias 1 and 5. C15 is time delayed from C14 by approximately 0.395" (average distance between the 1, 2, 4, and 5 PIC vias to their respective IDC vias). The area of the pad capacitor C14 is 0.021" by 0.021"±20%, and the area of the pad capacitor C15 is 0.028" by 0.028"±20%.
5) Crosstalk compensation for pair combination 36-12 is achieved by a pad capacitor C16 having the same polarity as the net crosstalk caused by the plug. It is connected between PIC via 1 and IDC via 6. This pad capacitor works in tandem with the pad capacitor C26 on the flex circuit board using the time delay method to achieve NEXT performance exceeding 500 MHz for pair combination 36-12. The area of pad capacitor C16 is 0.035" by 0.061" (±20%). The schematic for pair combination 36-12 can be seen in FIG. 11.
6) Crosstalk compensation for pair combination 36-78 is achieved by a pad capacitor C38 having the same polarity as the net crosstalk caused by the plug. It is connected between IDC via 3 and IDC via 8. This pad capacitor works in tandem with the pad capacitor C37 on the flex circuit board using the time delay method to achieve good NEXT performance at frequencies exceeding 500 MHz for pair combination 36-78. The area of pad capacitor C38 is 0.01" by 0.01" (±20%). The schematic for pair combination 36-78 can be seen in FIG. 12.
7) Crosstalk compensation for pair 45-36 is achieved by a lattice compensation technique. This lattice network includes the following:
   a. A pad capacitor C35 having opposite polarity from the net crosstalk caused by the plug for pair combination 45-36 connected between PIC vias 3 and 5. The pad capacitor area is 0.013" by 0.013" (±20%).
   b. A capacitor C46 of approximately 0.2 pF having opposite polarity from the net crosstalk caused by the plug for pair combination 45-36 which is created by the capacitance between trace 4 (leading to the C47 capacitor) and PIC via 6 (shown in FIG. 8). A small pad capacitor could be added here if the process, manufacturing, or engineering designs require it, but this capacitor's size should remain under 0.02" by 0.02".
   c. A pad capacitor C34 having same polarity of the net crosstalk caused by the plug for pair combination 45-36 is connected between wires 3 and 4 utilizing a self-inductive stub L3 of approximately 0.8" in length running between PIC 3 and the C34 pad capacitor. The other pad of the C34 capacitor terminates another self-inductive stub L4 of approximately 0.8" in length, which leads to a via on current carrying trace 4. The area of pad capacitor C34 is 0.029" by 0.029" (±20%).
   d. A pad capacitor C56 having the same polarity as the plug for pair combination 45-36 is connected between conductors 5 and 6 utilizing a self-inductive stub L6 of approximately 1.1" in length. The self-inductive stub L6 is connected to PIC 6, and runs to the C56 pad capacitor with time delay. The other pad of the C56 capacitor is connected to another self inductive stub L5 of approximately 0.8" in length, which runs to a via on current carrying trace 5. The area of pad capacitor C56 is 0.03" by 0.03" (±20%).
   e. The reason inductive stubs L4 and L5 do not connect directly to the PIC vias is that this allows for improved return loss in the jack by adding additional length away from the PICs.
   f. The schematic for pair combination 45-36 can be seen in FIG. 13, which further illustrates the lattice network used in this design.

Description of Overall Jack Compensation Technique for Each Pair Combination

This section describes how the flex board 24 and rigid board 16 work together in one embodiment of a jack.

Pair Combination 45-78

The schematic for pair combination 45-78 is shown in FIG. 9. The compensation technique on pair combination 45-78 does not use the flex board for any of its capacitors. It does not use the time delay or lattice network techniques either.

Pair Combination 45-12

The schematic for pair combination 45-12 is shown in FIG. 10. The compensation technique on pair combination 45-12 does not use the flex board for any of its capacitors. It does not use the lattice network either. However, it does make use of the time delay method by having C15 time delayed by approximately 0.395" (average distance between the 1, 2, 4, and 5 PIC vias to their respective IDC vias) from C14 (with both capacitors on rigid board 24).

Pair Combination 36-12

Figure 11:
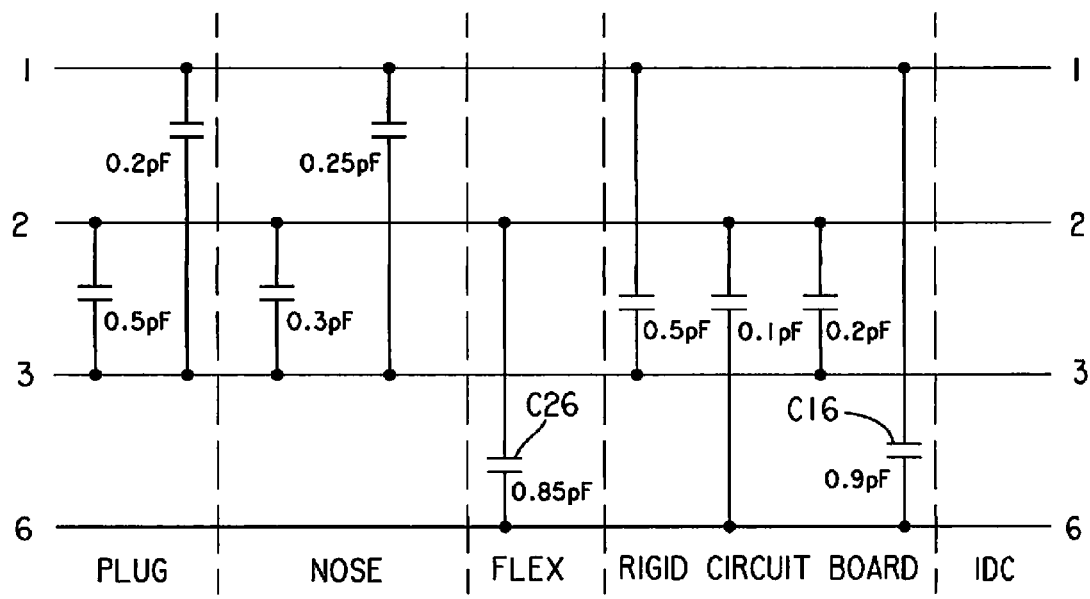

The schematic for pair combination 36-12 is shown in FIG. 11. It includes capacitor C26 on flex board 24 and C16 on rigid board 16. C16 is time delayed by approximately 0.68" from the C26. This includes the 0.5" length from the flex board to the PIC rigid board interface, and an additional length of 0.18" on the rigid board (based on half the distance between the 3 and 6 PIC vias and their respective IDC vias since the connection for pair 1 is on the PIC via whereas the connection for pair 6 is on the IDC via). There is no lattice network used on pair combination 36-12.

Pair Combination 36-78

Figure 12:
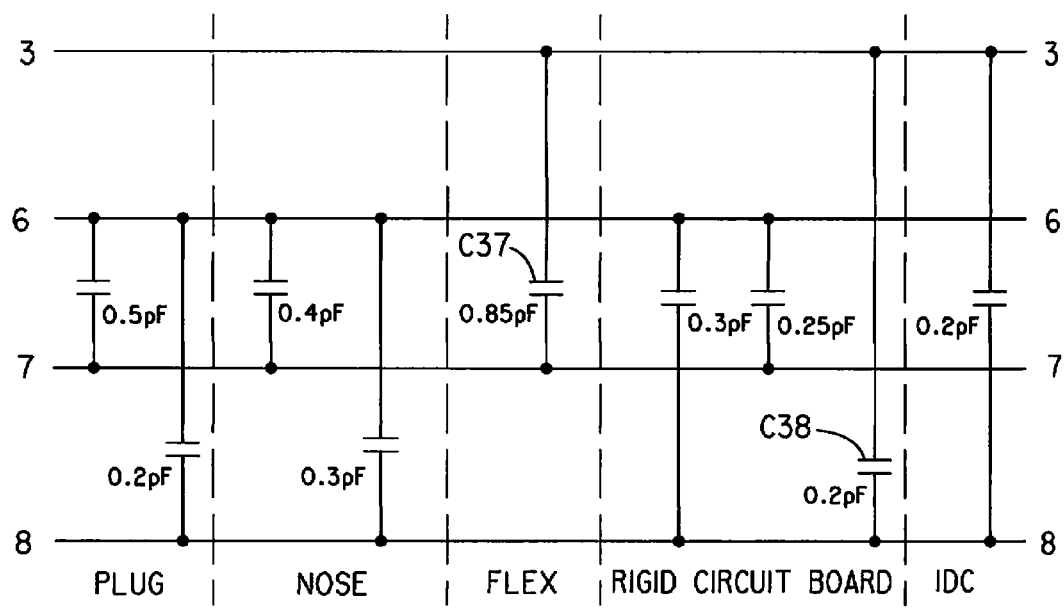

The schematic for pair combination 36-78 is shown in FIG. 12. It includes capacitor C37 on flex board 24 and capacitor C38 on rigid board 16. C38 is time delayed by approximately 0.75" from C37. This includes the 0.5" length from the flex board to the PIC rigid board interface, and an additional length of 0.25" on the rigid board (based on half the distance between the 3, 6, 7, and 8 PIC vias and their respective IDC vias). There is no lattice network used on pair combination 36-78.

Pair Combination 45-36

Figure 13:
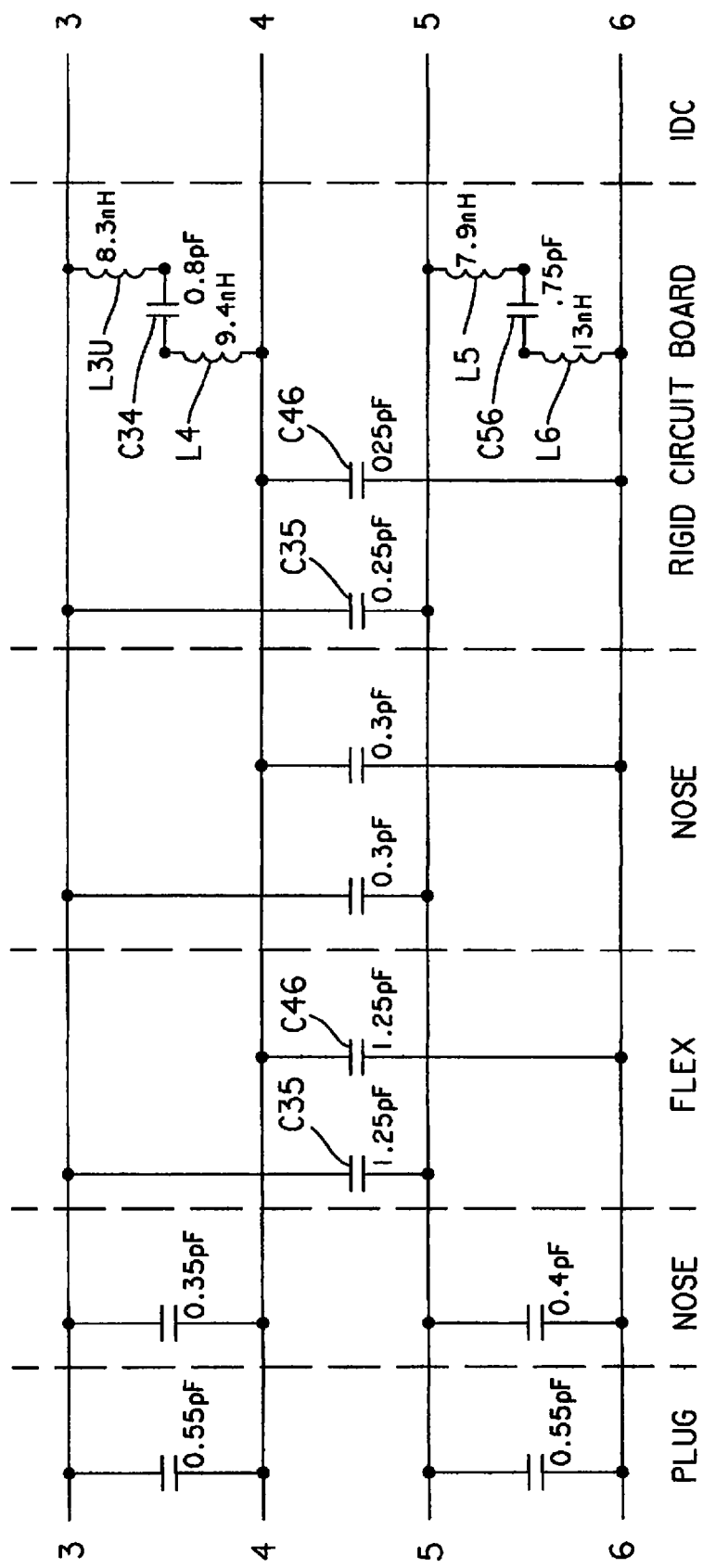

The schematic for pair combination 45-36 is shown in FIG. 13. It includes capacitors C35 and C46 on flex board 24. It also includes C35, C46, C34, C56, L3, L4, L5, and L6 on the rigid circuit board 16. Capacitors C34 and C56 are time delayed from the flex circuit board capacitors C35 and C46 by approximately 0.56". This includes the 0.5" length from the flex board to the PIC rigid board vias, and an additional length of 0.06" on the rigid board (based on half the distance between the 4 and 5 PIC vias and the plated through hole vias where the stubs associated with conductors 4 and 5 tap off). The combination of the capacitors on the flex circuit board 24, the capacitors on the rigid board 16, and the inductors comprises a lattice network. The addition of inductors L3, L4, L5, and L6 with C34 and C56 create a frequency-dependent vector that grows at a faster rate with frequency than the crosstalk caused by the C35 and C46 capacitors. This in turn allows for additional bandwidth on 45-36 NEXT up to and exceeding 500 MHz.

Additional Embodiments of Rigid Board 16

Additional Embodiment 1: Adjusting Trace Geometry

Figure 14:
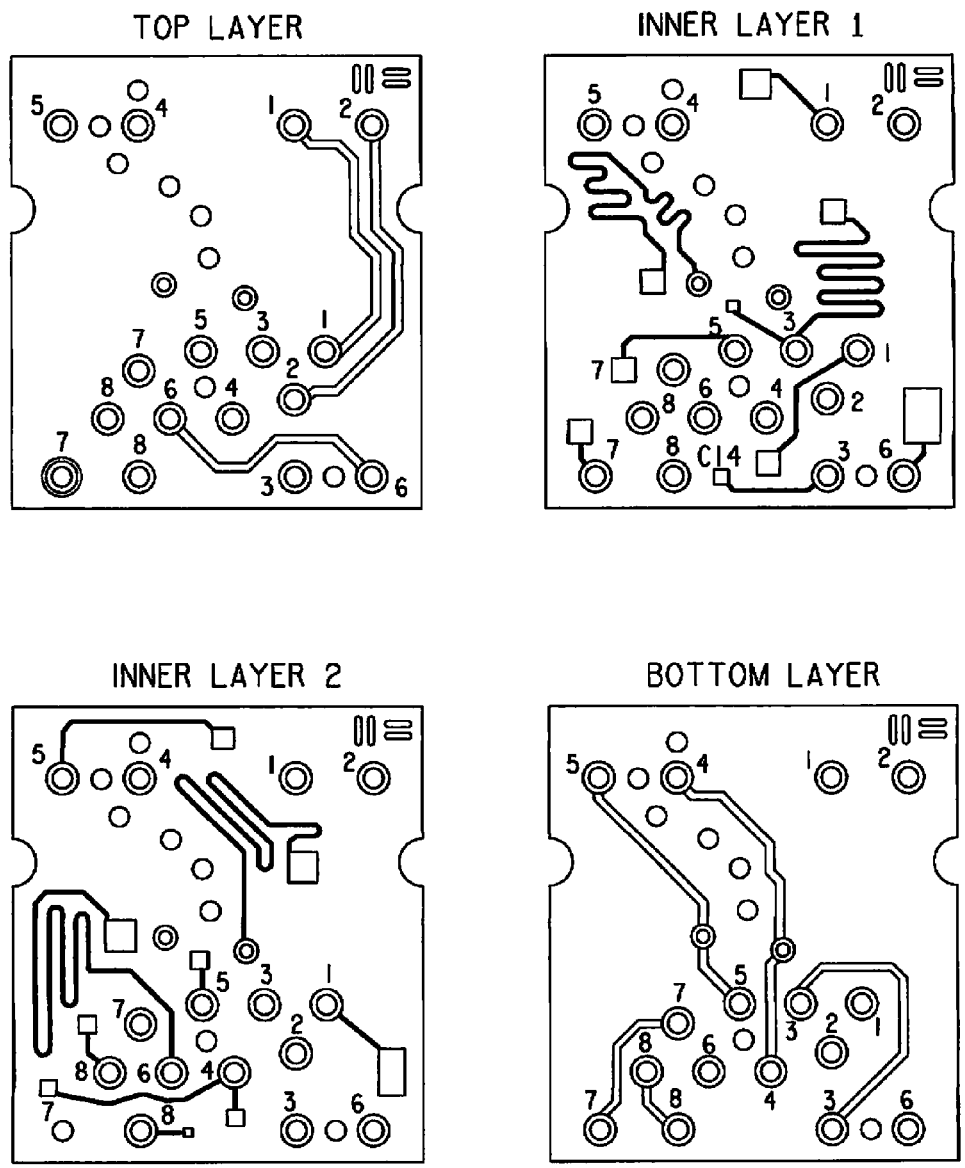

This embodiment, which gains additional NEXT bandwidth on pair combination 36-78, is shown in FIG. 14. This embodiment incorporates all aspects of the design described elsewhere herein except for the differences highlighted. The main reason for this change in routing is to reduce the parasitic capacitance between contacts 6 and 8 that can occur with L6. Note that several capacitor sizes are slightly changed to account for the new layout but stay within the aforementioned tolerance ranges. Also note that a C68 capacitor may be added to the design to allow this rigid circuit board to work with the flex board described in FIGS. 3-5. The schematic for this 36-78 pair combination is similar to FIG. 12, with the exception that the 0.25 pF parasitic capacitance on the rigid board has been made slightly smaller.

Additional Embodiment 2: Adjusting Trace

Geometry and Balancing Capacitance on Pair 45-12

Figure 15:
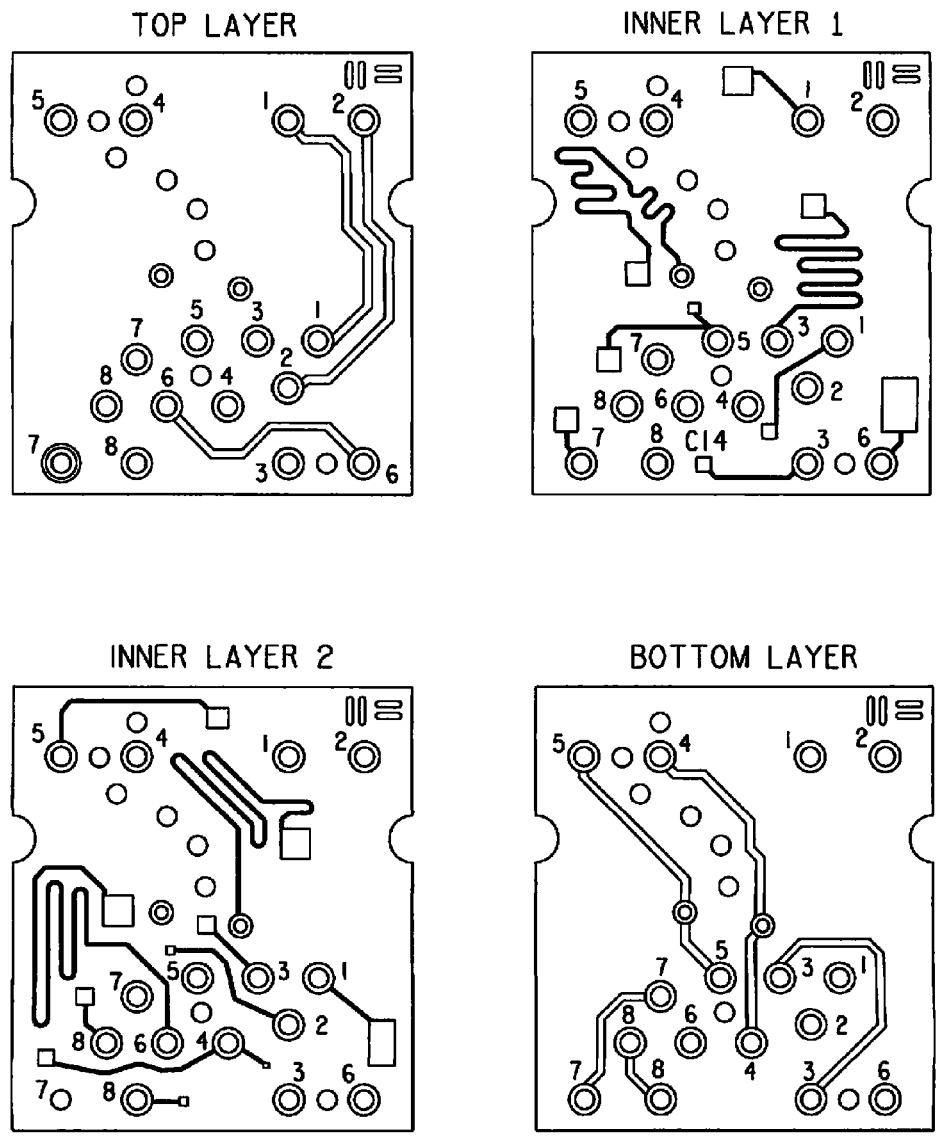
Figure 16:
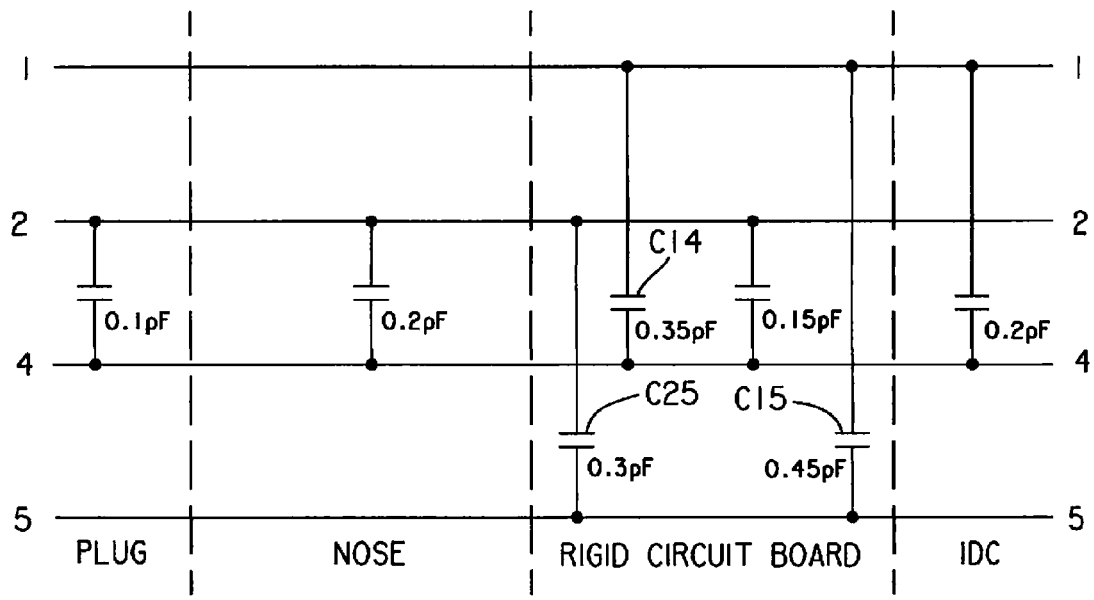

This embodiment, which gains additional NEXT bandwidth on pair combination 36-78, is shown in FIG. 15. This embodiment incorporates all aspects of the design described elsewhere herein, including both the main description and Additional Embodiment 1, except for the differences highlighted. The main reason for this change was to improve the mode conversion across pair combination 45-12 by adding C25. Note that several capacitor sizes are slightly changed to account for the new layout. A schematic for 45-12 is shown in FIG. 16. Note that for this schematic, C14, C25, C15, and C24 are all closer in their net value across the schematic which will result in improved mode conversion characteristics.

The invention claimed is:

1. A communication jack for use in a communication network, said jack having a plurality of plug interface contacts for making conductive contact with contacts of a plug, said communication jack comprising:
    eight current-carrying paths through the communication jack, said current-carrying paths comprising first, second, third, and fourth differential pairs of conductors, each of said differential pairs comprising a first and a second conductive pathway;
    compensation circuitry adapted to decrease the overall crosstalk when said communication jack is connected to a plug, said compensation circuitry comprising:
    a first capacitor connected between the first conductive pathway of the first differential pair and the second conductive pathway of the second differential pair;
    a second capacitor connected between the second conductive pathway of the first differential pair and the first conductive pathway of the second differential pair;
    a third capacitor connected between the first conductive pathway of the second differential pair and the first conductive pathway of the fourth differential pair; and
    a fourth capacitor connected between the second conductive pathway of the second differential pair and the second conductive pathway of the third differential pair;
    wherein said first, second, third, and fourth capacitors are provided on a flexible circuit board in electrical contact with said plug interface contacts and further are provided within a single stage of compensation in said jack; and
    wherein the jack further comprises a rigid circuit board containing compensation circuitry wherein the compensation circuitry comprises second stage lattice network crosstalk between the first and second differential pairs.

2. The communication jack of claim 1 wherein said plug interface contacts number eight and correspond to said eight current-carrying paths through said communication jack.

3. The communication jack of claim 1 further comprising a plurality of insulation displacement contacts connected to said rigid circuit board.

4. The communication jack of claim 1 wherein said plug interface contacts wrap around a nose of said jack and wherein a top layer of said flexible circuit board makes contact with said plug interface contacts in the area of said nose.

5. The communication jack of claim 1 wherein said additional compensation circuitry on said rigid circuit board comprises crosstalk compensation circuitry for compensating crosstalk between the first and fourth differential pairs.

6. The communication jack of claim 5 wherein said additional compensation circuitry on said rigid circuit board further comprises crosstalk circuitry for compensating crosstalk between the second and third differential pairs.

7. The communication jack of claim 6 wherein said additional compensation circuitry on said rigid circuit board further comprises crosstalk circuitry for compensating crosstalk between the second and fourth differential pairs.

* * * * *

UNITED STATES PATENT AND TRADEMARK OFFICE
CERTIFICATE OF CORRECTION

PATENT NO. : 8,137,141 B2  Page 1 of 1
APPLICATION NO. : 12/544626
DATED : March 20, 2012
INVENTOR(S) : Frank M. Straka et al.

It is certified that error appears in the above-identified patent and that said Letters Patent is hereby corrected as shown below:

Title page, item (75) Inventors, line 2, which reads "Ronald L. Tellas, Schereville, IN (US)" should read "Ronald L. Tellas, Schererville, IN (US)."

Signed and Sealed this
Twelfth Day of March, 2013

Teresa Stanek Rea
*Acting Director of the United States Patent and Trademark Office*